Feb. 3, 1970 P. A. ILES 3,493,822

SOLID STATE SOLAR CELL WITH LARGE SURFACE FOR RECEIVING RADIATION

Filed Feb. 24, 1966

INVENTOR.
PETER A. ILES

BY Lyon & Lyon

ATTORNEYS

United States Patent Office 3,493,822
Patented Feb. 3, 1970

3,493,822

SOLID STATE SOLAR CELL WITH LARGE SURFACE FOR RECEIVING RADIATION

Peter Albert Iles, Arcadia, Calif., assignor, by mesne assignments, to Globe-Union Inc., Milwaukee, Wis., a corporation of Delaware Filed Feb. 24, 1966, Ser. No. 529,726
Int. Cl. H01l *3/00, 5/00, 3/12*
U.S. Cl. 317—234 8 Claims

ABSTRACT OF THE DISCLOSURE

A photovoltaic device, such as a solar cell, in which the entire upper surface, with the exception of grid lines is available for receiving radiation and the entire bottom surface is available for making an ohmic contact to the bulk region. Insulating material covers a small portion of the top surface, continues around one edge, and extends a small distance onto the bottom surface. Contact material, overlaying the insulating material, makes electrical contact with the grid lines on the top surface of the device, continues around the edge, and extends over a portion of the insulating material on the bottom surface of the device.

This invention relates to semiconductor devices and more particularly relates to photovoltaic devices such as solar cells and a process of making them.

In U.S. patent application Ser. No. 184,347, filed Apr. 2, 1962, by Bernd Bross et al. and entitled "Solar Cell Device," there is disclosed a generally rectangular solar cell having a greater radiation receiving area than those theretofore obtainable. The construction of these cells also facilitates their flat mounting on a large panel. The cells according to that application are formed with a thin conductivity region of one type covering the entire top surface of a silicon wafer of the opposite conductivity type, continuing completely around one edge of the wafer and extending a small distance onto the bottom surface of the wafer. An ohmic contact covers the edge and bottom portions of the thin region and connects with grid strips formed on the top surface of the wafer. A second ohmic contact covers the entire remaining surface of the bottom of the cell except for a shallow groove which runs across the bottom of the cell and separates the two regions of opposite conductivity types and the two contacts.

In my co-pending U.S. patent application Ser. No. 313,478, filed Oct. 3, 1963, and entitled "Process of Making Solar Cells or the Like" there is disclosed another type of solar cell in which the P-N junction extends along the upper surface of the cell, continues completely around one edge of the cell and extends a small distance onto the bottom surface of the cell. This type of cell is now generally known in the art as a "wraparound" solar cell. The process disclosed in my co-pending application eliminates the need for etching the P-N junction and also permits the use of simple masks and less reactive etching or cleaning solutions. That process also provides protection for the P-N junction where it comes to the surface of the cell.

While the cells disclosed in the aforementioned co-pending applications, the disclosures of which are incorporated herein by reference, have been found to be satisfactory when the bulk semiconductor material is of low resistivity (less than 3 ohm-cm.), their electrical characteristic suffers somewhat from the fact that their back contact areas are not maximized as a result of the wrapped around junction. Any decrease in back contact area carries with it an increase in the parasitic series resistance of the cell. It is therefore desirable that the entire bottom surface of the cell be used for the back contact. On the other hand, it is desirable that the entire upper surface of the cell with the exception of the grid lines be available for receiving radiation. This, of course, is not possible in the conventional solar cell where a part of the top surface is devoted to the ohmic contact for the thin surface region lying on one side of the P-N junction. It is also desirable that the contacts to both regions of the cell be available on the bottom of the cell so that the cells can be mounted flat to a prefabricated circuit pattern such as a printed circuit on a panel or other substrate without using itnerconnecting contacts which project above the top surface of the cell.

It is therefore an object of the present invention to provide a photovoltaic device having improved efficiency over previously known devices of the same size.

It is another object of the present invention to provide a photovoltaic device in which the entire top surface of a semiconductor wafer is available for receiving radiation and in which the entire bottom surface is available for making an ohmic contact to the bulk region of the wafer.

It is also an object of the present invention to provide an improved process for making photovoltaic devices such as solar cells.

These and other objects and advantages of the present invention will become more apparent upon reference to the accompanying description and drawings in which.

Figure 1:
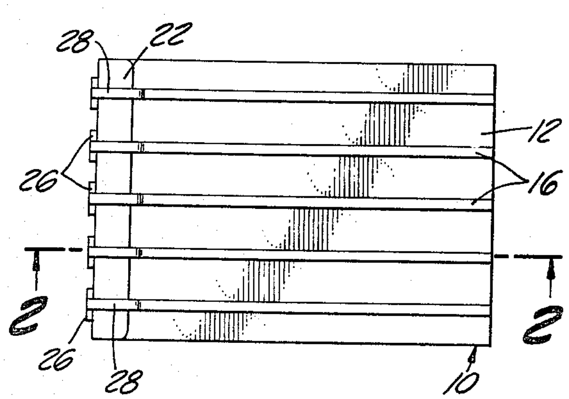
FIGURE 1 is a top plan view of a solar cell constructed according to the present invention.
Figure 2:
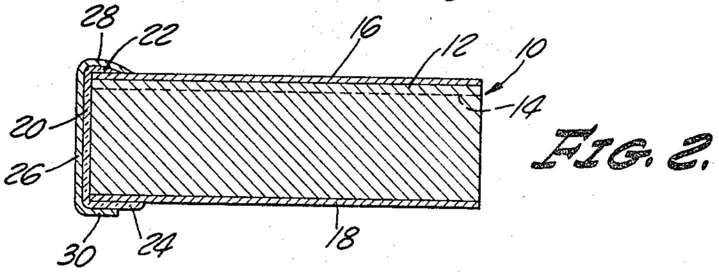
FIGURE 2 is a cross-sectional view taken along lines 2—2 of FIGURE 1.
Figure 3:
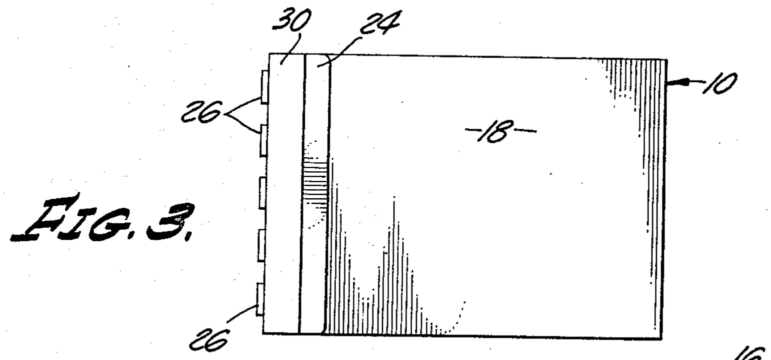
FIGURE 3 is a bottom plan view of the cell of FIGURE 1.

Briefly, the present invention provides a photovoltaic device such as a solar cell in which the entire upper surface, with the exception of the grid lines or strips, is available for receiving radiation and in which the entire bottom surface is available for making an ohmic contact to the bulk region. This is accomplished by forming, in the conventional manner, a thin surface region that covers the entire upper surface of the semiconductor wafer but which does not extend down any of the sides. Conventional grid lines are formed on the upper surface of the wafer and an ohmic contact made to substantially the entire bottom surface of the wafer.

An insulating material, preferably transparent, is then deposited on the wafer such that it covers a small portion of the top surface, continues around one edge, and extends a small distance onto the bottom surface of the cell. A suitable contact material is then deposited on the insulating material in such a manner that it makes electrical contact with the grid lines on the top surface of the wafer, continues around the edge of the wafer and extends over a portion of the insulating material on the bottom surface of the cell. Circuit connections can now be made to the metallic layer coating the bottom of the wafer and the conductive material overlying the insulating material.

A cell constructed in this manner thus has the advantages of a wraparound cell, that is, the entire top surface except for the grid lines is available to receive radiation, and the cell is easy to mount, and yet permits the entire bottom surface of the wafer to serve as part of the ohmic contact to the bulk semiconductor. Construction of the cell in this manner also eliminates the need to etch the junction on the bottom as is necessary in some wraparound cells.

Turning now to the drawings, there is shown a rectangular blank or wafer 10 of semiconductor material, preferably silicon, of a first conductivity type having formed therein a thin surface region 12 of the opposite conductivity type, the regions being separated by a P-N junction 14. The surface region 12 covers the entire top surface of the wafer 10. This region can be formed by any well known process, for example, by diffusing phosphorous into a wafer of P-type silicon. A plurality of thin metallic grid lines 16 are formed on the top surface of the wafer 10 and make ohmic contact with the region 12. The entire bottom surface of the wafer 10 is covered with a thin metallic layer 18 which forms an ohmic contact with the bulk region of the wafer 10. Both the grid lines 16 and the layer 18 may be of any suitable material, for example, titanium-silver.

On one end of the cell there is formed a thin layer 20 of a transparent insulating material, for example, one or more of the oxides of silicon. The layer 20 continues around the upper edge of the wafer to form a portion 22 which extends a short distance onto the top surface of the wafer and a portion 24 which extends a short distance onto the bottom surface of the wafer 10. A plurality of discrete strips 26 of a conductive material such as silver are deposited on the insulating layer 20 and are continued around the upper edge of the wafer so as to have portions 28 which extend onto the top surface of the wafer 10 beyond the portion 22 of the insulating layer 20. The portions 28 are brought into electrical contact with the grid lines 16 and preferably are the same width as the grid lines. A strip 30 of conductive material, preferably the same material as that of the strips 26, is formed on the bottom surface of the wafer 10 but is not as wide as the portion 24 of the insulating layer 20 so that the conductors 18 and 30 are insulated from each other by the layer 20. If desired, the strips 26 can be widened so that they merge to form one complete coating. Preferably all of this conductive material is simultaneously deposited on the insulating layer.

It should be understood that the scale of the cell shown in the drawings is not accurate and in actual practice the portion 24 of the layer 20 and the strip 30 would be very thin so that effectively there would be no appreciable step or vertical displacement on the bottom of the cell. The typical thickness of the insulating layer would be about 1000–10,000 A. while the metal would be at most several microns thick. The two conductive areas 18 and 30 may easily be soldered or otherwise fastened to different regions on a suitable substrate so that any desired electrical combination of a plurality of such cells may be made.

Figures 4, 5:
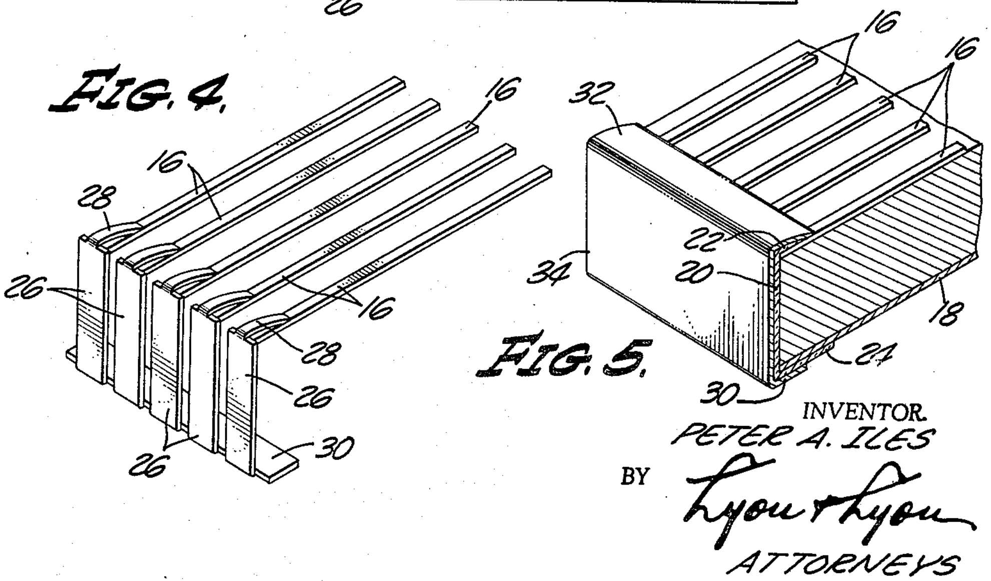
FIGURE 4 is a perspective view of the contact structure of the photovoltaic device of FIGURE 1.
FIGURE 5 is a perspective view of a modification of the cell of FIGURE 1.

If desired, instead of providing the strips 26 with thin portions 28 which electrically contact the grid lines 16, a very narrow contact strip can be formed on the portion of the insulating layer on the top of the cell to extend past the edge of the insulating layer and make contact with the grid lines and ohmic contact with the surface region itself. A structure of this type is shown in FIGURE 5 in which similar elements are given the same number, heretofore assigned. In this figure, the portion 22 of the insulating layer covers a very small portion of the top surface of the wafer. A strip 32 of conductive material is deposited on the portion 22 of the insulating layer and extends beyond it to electrically contact the grid lines 16. The strip 32 is connected to the strip 30 by a layer of conductive material 34 that preferably is of the same material and deposited at the same time as the strips 30 and 32.

It should be understood that the cell of FIGURE 5 is also not drawn to scale and does not indicate the actual dimensions of the various elements. Typically, the distance the portion 22 of the insulating layer extends onto the top surface of the cell from the end thereof would be about 10 mils providing a contact strip one mil wide. Thus, although some radiation receiving surface would be lost by the provision of the strip 32, it would be a very small percentage of the total and would not appreciably degrade the performance of the cell. Any such degradation that would result from the presence of the contact strip might be compensated for in fabrication cost by the elimination of the indexing accuracy needed to match the portions 28 of the strips 26 with the grid lines 16, as required in the embodiment of FIGURE 1.

A process by which the above-described solar cell may be formed is as follows: A wafer of P-type silicon is raised to and held at a temperature between 800° C. and 1100° C. A vapor of $P_2O_5$ at a temperature between 220° C. and 370° C. is passed over the silicon in a stream of carrier gas such as oxygen. This operation results in phosphorous impurity atoms being diffused into the silicon wafer 10 to form the region 12 and the junction 14, and also results in the formation of a coating of phosphoro-silicon glass on the surface of the entire wafer 10. The wafer is then cooled and the glass coating is removed by immersing the cell in a bath of hydrofluoric acid. A shadow mask is then placed over the upper surface of the cell and contact metal is evaporated through the holes of the mask. This evaporated contact may consist, for example, of a combination of titanium and silver. The bottom of the wafer is now sand-blasted or etched to remove the glass coating and the phosphorous diffused silicon region and expose the pure P-type silicon. A contact metal such as a combination of titanium and silver is now evaporated on the exposed P-type silicon or, alternatively, this bottom contact can be formed by electrolessly plating nickel. The upper and lower surfaces of the cell are now masked and the edges treated with an etching solution such as hydrofluoric acid-nitric acid mixtures to remove the glass and diffused silicon layers that have been formed by the diffusion operation and to clean the junction of shorting paths. The masks are then removed.

The entire cell is now masked except for one end, a minor portion of the upper surface adjacent that end, and a minor portion of the lower surface adjacent that end. A film of silicon oxide is now evaporated onto the exposed area of the cell. This can conveniently be done by use of a conventional evaporator with a silicon monoxide source and at a relatively high oxygen or air pressure, for example, about $5 \times 10^{-4}$ torr. A desirable thickness for the insulating layer is typically between 1,000 and 10,000 angstrom units and this can be achieved by maintaining the temperature of the cell at between 20° C. and 50° C. and evaporating as just described for about five minutes. Many other insulating materials could also be used. Examples of such material are $MgF_2$ and $Al_2O_3$. Various plastics or glasses capable of being deposited in a thin film could also be used.

The cell is then removed from the evaporator and the masks are removed. The cell is now remasked and a suitable metal is evaporated to form a conductive area on a portion of the insulating layer on the bottom of the cell and to connect this area with the grid lines on the top of the cell. The masking can be arranged so that strips such as those shown at 26 in FIGURES 1 through 4 are formed, or so that the entire end of the cell is covered with metal as shown in FIGURE 5. The evaporating metal may be silver, titanium-silver, chromium-copper, gold, manganese-silver, or any other metal or alloy that will adhere to the insulation and be of low resistance. The contact metal evaporation is carried out in the conventional manner to form a metal film having a thickness on the order of several microns or less. The masks are now removed and the bottom contact and the contact area formed on the insulating layer overlying the bottom contact may be soldered in the conventional manner. If desired, small area soldered connections may be made to these two regions. The cell is now ready for mounting on any suitable substrate.

A solar cell of the type described above has been found to have a higher $I_{sc}$ than conventional cells while showing no degradation of the I–V curve shape. The cell is easy to mount on panels because both contacts are on the bottom surface of the cell. In the fabrication of a solar panel, cells of this type permit the use of a single cover slide over a large number of cells as no top contact is needed and thus there are no tabs or the like extending above the upper surfaces of the cells. While solar cells of various configurations have been illustrated and described, it will be obvious to those skilled in the art that the teachings of the present invention could be applied to various other photovoltaic devices, such as readout devices, and that other processes could be utilized within the scope of the present invention.

The invention may be embodied in other specific forms not departing from the spirit or central characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A photovoltaic device comprising:

a body of semiconductor material, said body having a bulk region of a first conductivity type and a surface region of a second conductivity type, said regions being separated by a P-N junction;

at least one contact line formed on said surface region and making ohmic contact therewith;

an ohmic contact formed on the undersurface of said bulk region and extending substantially over the entirety of said undersurface;

a layer of insulating material disposed on a portion of said surface region of said body, continuing down one side of said body, and extending over a minor portion of said ohmic contact formed on said undersurface;

and thin film conductive means disposed on said insulating layer, said conductive means making electrical contact with said contact line, continuing down said one side and extending over a minor portion of said layer on said undersurface, said layer insulating said conductive means from said ohmic contact.

2. The device of claim 1 including a plurality of said contact lines and said conductive means includes a plurality of discrete portions, each of said discrete portions making electrical contact with an individual one of said contact lines.

3. A photovoltaic device comprising:

a rectangular body of silicon, said body having a bulk region of a first conductivity type and a surface region of a second conductivity type, said surface region being restricted to the top surface of said bulk region, said regions being separated by a P-N junction;

a plurality of grid lines formed on said surface region and making ohmic contact therewith;

an ohmic contact formed on the bottom of said bulk region and substantially entirely covering said bottom;

a thin layer of insulating material disposed on a minor portion of said surface region, continuing down one side of said body, and extending over a minor portion of said bulk region ohmic contact;

a thin film of a conductive material disposed on said insulating layer, said conductive film making electrical contact with said grid lines, continuing down one side and extending over a minor portion of said insulating layer on said bottom, said insulating layer insulating said conductive film from said ohmic contact.

4. The device of claim 3 wherein a film contact strip is formed on said surface region and makes ohmic contact therewith, said film of conductive material making electrical contact with said grid lines through said contact strip.

5. The device of claim 3 wherein said conductive film includes discrete portions, each of which extend beyond said insulating layer to make electrical contacts with individual of said contact lines.

6. The device of claim 5 wherein said insulating layer is selected from the group consisting of an oxide of silicon, $MgF_2$ and $Al_2O_3$.

7. The device of claim 5 wherein said insulating layer is a plastic material.

8. The device of claim 5 wherein said insulating layer is glass.

References Cited

UNITED STATES PATENTS

| | | | |
|---|---|---|---|
| 3,053,926 | 9/1962 | Ben-Sira et al. | 317—235 |
| 3,094,439 | 6/1963 | Mann et al. | 136—89 |
| 3,340,096 | 9/1967 | Mann et al. | 136—89 |
| 3,350,775 | 11/1967 | Iles | 317—235 |
| 3,359,137 | 12/1967 | Kaye et al. | 136—89 |

JAMES D. KALLAM, Primary Examiner

U.S. Cl. X.R.

136—89; 317—240